(12) United States Patent
Park et al.

(10) Patent No.: US 12,431,094 B2
(45) Date of Patent: *Sep. 30, 2025

(54) DISPLAY DEVICE

(71) Applicant: Samsung Display Co., LTD., Yongin-si (KR)

(72) Inventors: Sehyuk Park, Seongnam-si (KR); Hyo-Jin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,167

(22) Filed: Jan. 2, 2024

(65) Prior Publication Data

US 2024/0135888 A1 Apr. 25, 2024
US 2024/0233654 A9 Jul. 11, 2024

Related U.S. Application Data

(63) Continuation of application No. 17/273,340, filed as application No. PCT/KR2019/007907 on Jun. 28, 2019, now Pat. No. 11,869,446.

(30) Foreign Application Priority Data

Sep. 20, 2018 (KR) .......................... 10-2018-0113318

(51) Int. Cl.
  *G09G 3/3291* (2016.01)
  *H10K 59/121* (2023.01)

(52) U.S. Cl.
  CPC ....... *G09G 3/3291* (2013.01); *H10K 59/1213* (2023.02); *H10K 59/1216* (2023.02); *G09G 2310/0272* (2013.01)

(58) Field of Classification Search
  CPC .. G09G 3/3233; G09G 3/3275; G09G 3/3291; G09G 3/3266; G09G 2300/0861;
  (Continued)

(56) References Cited

U.S. PATENT DOCUMENTS 9,875,681 B2 1/2018 Lee et al.
10,186,199 B2 1/2019 Jeon
(Continued)

FOREIGN PATENT DOCUMENTS

EP 2743910 A1 6/2014
EP 3193323 A2 7/2017
(Continued)

OTHER PUBLICATIONS

Extended European Search Report for Application No. 19863037.8-1207 dated Aug. 11, 2022 enumerating the references in the Extended European Search Report.
(Continued)

*Primary Examiner* — Shaheda A Abdin
(74) *Attorney, Agent, or Firm* — CANTOR COLBURN LLP

(57) ABSTRACT

A display device includes a display panel including a pixel including switching elements of a first type and a second type different from the first type, a gate driver for generating a gate signal based on a gate clock signal and providing the gate signal to the display panel, a data driver for providing data voltage to the display panel, an emission controller for providing an emission controlling signal to the display panel, and a driving controller for generating control signals for controlling the gate and data drivers, and the emission controller. In a low-frequency driving mode, the display panel operates in a writing frame for writing data in the pixel and in a holding frame for holding the data written in the pixel, and the driving controller provides the gate driver with
(Continued)

a gate clock signal having a direct current (DC) voltage during the holding frame.

20 Claims, 8 Drawing Sheets

(58) Field of Classification Search
CPC ... G09G 2300/0842; G09G 2320/0214; G09G 2340/0435; G09G 2310/0272; G09G 2300/0819; G09G 2330/021; G09G 2310/0262; H10K 59/1216; H10K 59/1213
See application file for complete search history.

(56) References Cited

U.S. PATENT DOCUMENTS

| | | | |
|---|---|---|---|
| 2002/0063674 | A1 | 5/2002 | Chiang |
| 2009/0079713 | A1 | 3/2009 | Nagashima |
| 2012/0169698 | A1* | 7/2012 | Park ............... G09G 3/20 345/211 |
| 2014/0118323 | A1 | 5/2014 | Park |
| 2014/0139418 | A1 | 5/2014 | Kim et al. |
| 2014/0160182 | A1 | 6/2014 | Hong et al. |
| 2015/0243203 | A1 | 8/2015 | Kim et al. |
| 2016/0148571 | A1 | 5/2016 | Cho et al. |
| 2016/0372037 | A1 | 12/2016 | Lim et al. |
| 2017/0004766 | A1 | 1/2017 | Cho et al. |
| 2017/0092191 | A1* | 3/2017 | An ............... G09G 3/3233 |
| 2017/0092198 | A1 | 3/2017 | Ryu et al. |
| 2017/0206837 | A1 | 7/2017 | Jeon |
| 2018/0006099 | A1 | 1/2018 | Ka et al. |
| 2018/0090073 | A1 | 3/2018 | Lee et al. |
| 2018/0226029 | A1* | 8/2018 | Park ............... G09G 3/3266 |
| 2019/0180689 | A1 | 6/2019 | Chen et al. |
| 2021/0327368 | A1* | 10/2021 | Park ............... G09G 3/3275 |

FOREIGN PATENT DOCUMENTS

| | | |
|---|---|---|
| JP | 201552632 A | 3/2015 |
| KR | 1020110013687 A | 2/2011 |
| KR | 1020150086973 A | 7/2015 |
| KR | 1020150100978 A | 9/2015 |
| KR | 1020160015451 A | 2/2016 |
| KR | 1020170023359 A | 3/2017 |
| KR | 1020180018888 A | 2/2018 |

OTHER PUBLICATIONS

Partial Supplementary European Search Report for Application No. 19863037.8-1207 dated May 9, 2022 enumerating the references listed in the Partial Supplementary European Search Report.
International Search Report mailed Oct. 1, 2019 for PCT/KR2019/007907.
European Summons to attend oral proceedings pursuant to Rule 115(1) EPC and communication from the Examining Division, Dated Mar. 19, 2024, issued in corresponding European application No. 19863037.8, (11 pages).
European Summons to attend oral proceedings pursuant to Rule 115(1) EPC and communication from the Examining Division, Dated Mar. 19, 2024, issued in corresponding European application No. 19863037.8, (2 pages).

* cited by examiner

DISPLAY DEVICE

CROSS REFERENCE TO RELATED APPLICATION

This application is a continuation of U.S. patent application Ser. No. 17/273,340, filed on Mar. 4, 2021, which claims priority to International Patent Application No. PCT/KR2019/007907, filed on Jun. 28, 2019, and Korean Patent Application No. 10-2018-0113318, filed on Sep. 20, 2018, and all the benefits accruing therefrom under 35 U.S.C. § 119, the entire disclosure of which is incorporated by reference herein in its entirety.

TECHNICAL FIELD

The present invention relates to a display device and a method of driving the same.

BACKGROUND

In general, a display device includes a display panel and a display panel driver. The display panel includes a plurality of pixels, a plurality of gate lines, a plurality of data lines, and a plurality of emission control lines. The display panel driver includes a gate driver configured to provide a gate signal to the gate lines, a data driver configured to provide a data voltage to the data lines, an emission controller configured to provide an emission control signal to the emission control lines, and a driving controller configured to generate control signals for controlling the gate driver, the data driver, and the emission controller.

When an image displayed on the display panel is a still image, or the display panel is driven in an always-on-display ("AOD") mode, a method for reducing power consumption through low-frequency driving has been researched.

SUMMARY

Problem to be Solved

One aspect of the present invention is to provide a display device capable of reducing power consumption of a display panel.

However, the aspect of the present invention is not limited thereto. Thus, the aspect of the present invention may be extended without departing from the spirit and the scope of the present invention.

Means for Solving the Problem

According to embodiments, a display device includes a display panel including a pixel including a switching element of a first type and a switching element of a second type that is different from the first type, a gate driver which generates a gate signal based on a gate clock signal and provides the gate signal to the display panel, a data driver which provide a data voltage to the display panel, an emission controller which provides an emission control signal to the display panel, and a driving controller which generates control signals for controlling the gate driver, the data driver, and the emission controller. Here, in a low-frequency driving mode, the driving controller provides the gate clock signal that swings between a high level and a low level to the gate driver during a writing frame for writing data to the pixel and provides the gate clock signal having a direct current (DC) voltage to the gate driver during a holding frame for holding the data written in the pixel.

In embodiments, in the low-frequency driving mode, the gate clock signal may swing between the high level and the low level during the writing frame and may be maintained at the low level during the holding frame.

In embodiments, in the low-frequency driving mode, the gate clock signal may swing between the high level and the low level during the writing frame and may be maintained at the high level during the holding frame.

In embodiments, the switching element of the first type may be a poly-silicon thin film transistor. In addition, the switching element of the second type may be an oxide thin film transistor.

In embodiments, the switching element of the first type may be a P-type transistor. In addition, the switching element of the second type may be an N-type transistor.

In embodiments, the pixel may include a first switching element including a gate electrode connected to a first node, a first electrode connected to a second node, and a second electrode connected to a third node, a second switching element including a gate electrode to which a first data write gate signal is applied, a first electrode to which the data voltage is applied, and a second electrode connected to the second node, a third switching element including a gate electrode to which a second data write gate signal is applied, a first electrode connected to the first node, and a second node connected to the third node, a fourth switching element including a gate electrode to which a data initialization gate signal is applied, a first electrode to which an initialization voltage is applied, and a second electrode connected to the first node, a fifth switching element including a gate electrode to which the emission control signal is applied, a first electrode to which a high power supply voltage is applied, and a second electrode connected to the second node, a sixth switching element including a gate electrode to which the emission control signal is applied, a first electrode connected to the third node, and a second electrode connected to an anode electrode of an organic light emitting diode, a seventh switching element including a gate electrode to which an organic light emitting diode initialization gate signal is applied, a first electrode to which the initialization voltage is applied, and a second electrode connected to the anode electrode of the organic light emitting diode, a storage capacitor including a first electrode to which the high power supply voltage is applied and a second electrode connected to the first node, and the organic light emitting diode including the anode electrode and a cathode electrode to which a low power supply voltage is applied, and the gate signal generated from the gate driver includes the first and second data write gate signals, the data initialization gate signal, and the organic light emitting diode initialization gate signal.

In embodiments, the first switching element, the second switching element, the fifth switching element, and the sixth switching element may be the poly-silicon thin film transistors. In addition, the third switching element, the fourth switching element, and the seventh switching element may be the oxide thin film transistors.

In embodiments, in the low-frequency driving mode, the second switching element, the fifth switching element, and the sixth switching element may be driven at a first driving frequency, and the third switching element may be driven at a second driving frequency that is lower than the first driving frequency.

In embodiments, the driving controller may include a gate controller which generates the gate clock signal.

According to embodiments, a display device includes a display panel including a pixel including a switching element of a first type and a switching element of a second type that is different from the first type, a gate driver which provides a gate signal to the display panel, a data driver which provides a data voltage to the display panel, an emission controller which provides an emission control signal to the display panel, and a driving controller which generates control signals for controlling the gate driver, the data driver, and the emission controller. Here, in a low-frequency driving mode, the driving controller provides a first analog driving voltage for operating the data driver to the data driver during a writing frame for writing data to the pixel and provides a second analog driving voltage that does not operate the data driver to the data driver during a holding frame for holding the data written in the pixel.

In embodiments, in the low-frequency driving mode, the driving controller may provide the first analog driving voltage having a first voltage level to the data driver during the writing frame and may provide the second analog driving voltage having a second voltage level that is lower than the first voltage level to the data driver during the holding frame.

In embodiments, the switching element of the first type may be a poly-silicon thin film transistor. In addition, the switching element of the second type may be an oxide thin film transistor.

In embodiments, the switching element of the first type may be a P-type transistor. In addition, the switching element of the second type may be an N-type transistor.

In embodiments, the pixel may include a first switching element including a gate electrode connected to a first node, a first electrode connected to a second node, and a second electrode connected to a third node, a second switching element including a gate electrode to which a first data write gate signal is applied, a first electrode to which the data voltage is applied, and a second electrode connected to the second node, a third switching element including a gate electrode to which a second data write gate signal is applied, a first electrode connected to the first node, and a second node connected to the third node, a fourth switching element including a gate electrode to which a data initialization gate signal is applied, a first electrode to which an initialization voltage is applied, and a second electrode connected to the first node, a fifth switching element including a gate electrode to which the emission control signal is applied, a first electrode to which a high power supply voltage is applied, and a second electrode connected to the second node, a sixth switching element including a gate electrode to which the emission control signal is applied, a first electrode connected to the third node, and a second electrode connected to an anode electrode of an organic light emitting diode, a seventh switching element including a gate electrode to which an organic light emitting diode initialization gate signal is applied, a first electrode to which the initialization voltage is applied, and a second electrode connected to the anode electrode of the organic light emitting diode, a storage capacitor including a first electrode to which the high power supply voltage is applied and a second electrode connected to the first node, and the organic light emitting diode including the anode electrode and a cathode electrode to which a low power supply voltage is applied, and the gate signal generated from the gate driver includes the first and second data write gate signals, the data initialization gate signal, and the organic light emitting diode initialization gate signal.

In embodiments, the first switching element, the second switching element, the fifth switching element, and the sixth switching element may be the poly-silicon thin film transistors. In addition, the third switching element, the fourth switching element, and the seventh switching element may be the oxide thin film transistors.

In embodiments, in the low-frequency driving mode, the second switching element, the fifth switching element, and the sixth switching element may be driven at a first driving frequency, and the third switching element may be driven at a second driving frequency that is lower than the first driving frequency.

In embodiments, the pixel may further include an eighth switching element including a gate electrode to which a sustaining voltage enable signal is applied, a first electrode to which a sustaining voltage is applied, and a second electrode connected to the first electrode of the second switching element.

In embodiments, in the low-frequency driving mode, the driving controller may provide the first analog driving voltage to the data driver during the writing frame and may provide the sustaining voltage to the pixel during the holding frame.

In embodiments, the eighth switching element may be the poly-silicon thin film transistor.

In embodiments, the driving controller may include a voltage generator which generates the voltages provided to the data driver and the pixel.

Effects of the Invention

According to embodiments of the present invention, in the low-frequency driving mode of the display device including the pixel including the switching element of the first type and the switching element of the second type, the display device provides the gate clock signal having the direct current voltage to the gate driver during the holding frame, so that power consumption can be reduced.

According to embodiments of the present invention, in the low-frequency driving mode of the display device including the pixel including the switching element of the first type and the switching element of the second type, the display device does not operate the data driver during the holding frame, so that the power consumption can be reduced.

In addition, according to embodiments of the present invention, in the low-frequency driving mode of the display device including the pixel including the switching element of the first type and the switching element of the second type, the display device supplies the sustaining voltage to the pixel during the holding frame, so that a leakage current can be effectively prevented from being generated, and luminance of the pixel can be constantly maintained.

DETAILED DESCRIPTION

Hereinafter, embodiments of the present invention will be explained in detail with reference to the accompanying drawings.

Figure 1:
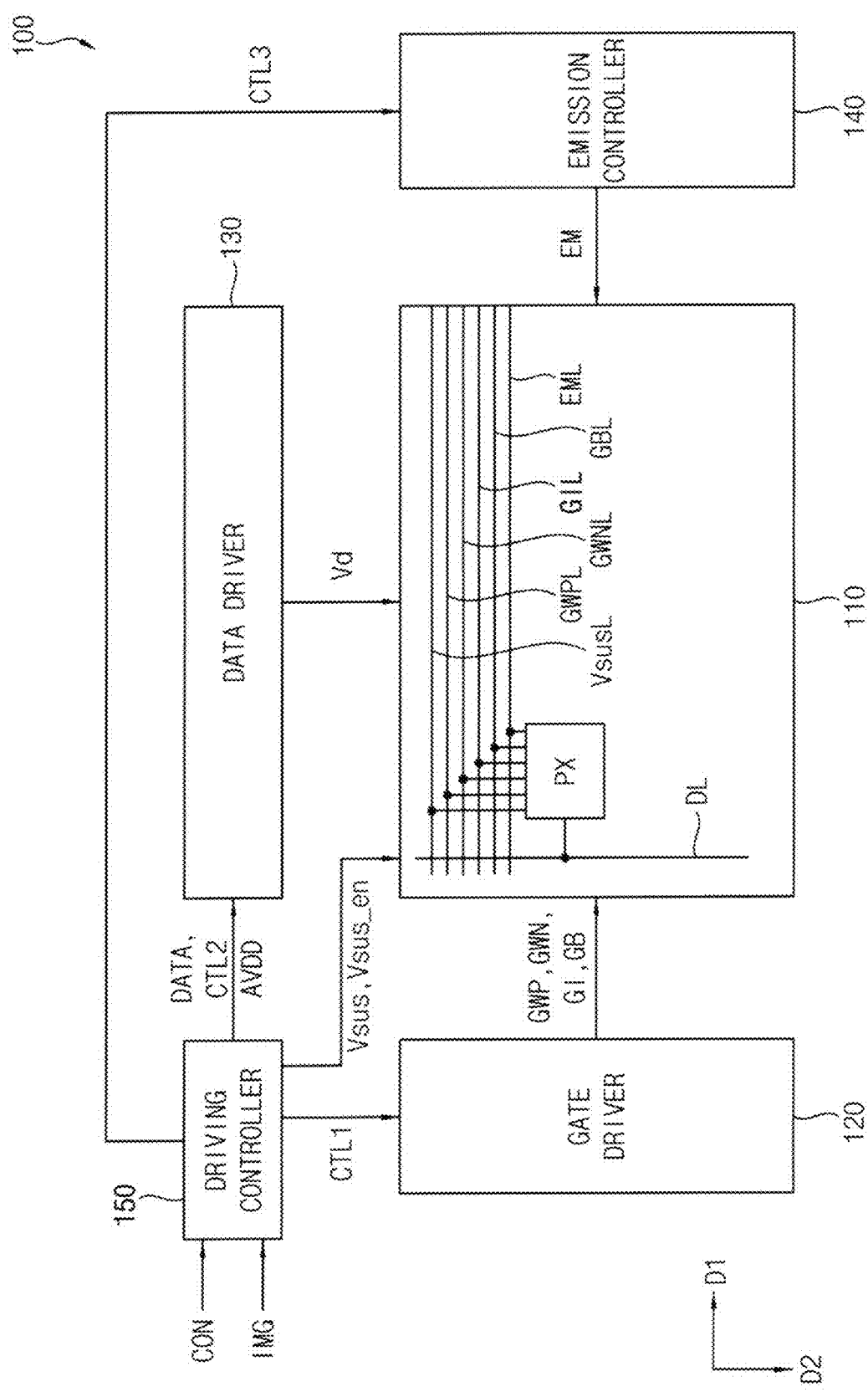
FIG. 1 is a block diagram illustrating a display device according to embodiments of the present invention.

FIG. 1 is a block diagram illustrating a display device according to embodiments of the present invention.

Referring to FIG. 1, a display device 100 may include a display panel 110 and a display panel driver. The display panel driver may include a gate driver 120, a data driver 130, an emission controller 140, and a driving controller 150.

The display panel 110 may include a plurality of gate lines GWPL, GWNL, GIL, and GBL, a plurality of data lines DL, a plurality of emission control lines EML, sustaining voltage supply lines VsusL, and a plurality of pixels PX. The plurality of pixels PX may be electrically connected to the gate lines GWPL, GWNL, GIL, and GBL, the data lines DL, the emission control lines EML, and the sustaining voltage supply lines VsusL. The gate lines GWPL, GWNL, GIL, and GBL, the emission control lines EML, and the sustaining voltage supply lines VsusL may extend in a first direction D1, and may be arranged in a second direction D2 perpendicular to the first direction D1. The data lines DL may extend in the second direction D2, and may be arranged in the first direction D1. The first direction D1 may be parallel to a long side of the display panel 110, and the second direction D2 may be parallel to a short side of the display panel 110. Each of the pixels PX may be disposed in a region where the gate lines intersect the data lines DL.

The driving controller 150 may receive input image data IMG and an input control signal CON from an external device. For example, the input image data IMG may include red image data, green image data, and blue image data. The input image data IMG may include white image data. The input image data IMG may include magenta image data, yellow image data, and cyan image data. The input control signal CON may include a master clock signal and a data enable signal. The input control signal CON may further include a vertical synchronization signal and a horizontal synchronization signal.

The driving controller 150 may generate control signals CTL1, CTL2, and CTL3 for controlling the gate driver 120, the data driver 130, and the emission controller 140, respectively, based on the input image data IMG and the input control signal CON.

The driving controller 150 may generate a first control signal CTL1 for controlling an operation of the gate driver 120 based on the input control signal CON. The driving controller 150 may output the first control signal CTL1 to the gate driver 120. For example, the first control signal CTL1 may include a vertical start signal and a gate clock signal. In one embodiment, in a low-frequency driving mode, the driving controller 150 may provide a gate clock signal that swings between a high level and a low level to the gate driver 120 during a writing frame for writing data to the pixel PX, and provide a gate clock signal having a direct current ("DC") voltage to the gate driver 120 during a holding frame for holding the data written in the pixel PX. For example, the driving controller 150 may include a gate controller configured to generate the gate clock signal.

The driving controller 150 may generate a second control signal CTL2 for controlling an operation of the data driver 130 based on the input control signal CON. The driving controller 150 may output the second control signal CTL2 to the data driver 130. For example, the second control signal CTL2 may include a horizontal start signal and a load signal.

The driving controller 150 may generate a data signal DATA based on the input image data IMG. For example, the driving controller 150 may convert the input image data IMG into the data signal DATA by applying an algorithm for compensating for image quality of the input image data IMG. The driving controller 150 may output the data signal DATA to the data driver 130.

In addition, the driving controller 150 may generate an analog driving voltage AVDD for operating the data driver 130. The driving controller 150 may output the analog driving voltage AVDD to the data driver 130. Further, the driving controller 150 may generate a sustaining voltage Vsus for constantly maintaining a driving current of the pixel PX. The driving controller 150 may provide the sustaining voltage Vsus to the pixel PX. For example, the driving controller 150 may include a voltage generator configured to generate a voltage provided to the data driver 130 and the pixel PX. In one embodiment, in the low-frequency driving mode, the driving controller 150 may provide an analog driving voltage AVDD having a first voltage level to the data driver 130 during the writing frame, and provide an analog driving voltage AVDD having a second voltage level (e.g., 0 volts (V)) to the data driver 130 during the holding frame. In another embodiment, in the low-frequency driving mode, the driving controller 150 may provide the analog driving voltage AVDD having the first voltage level to the data driver 130 during the writing frame, and provide a sustaining voltage Vsus having a third voltage level to the pixel PX during the holding frame. For example, the third voltage level may be equal to or different from the first voltage level.

The driving controller 150 may generate a third control signal CTL3 for controlling an operation of the emission controller 140 based on the input control signal CON. The driving controller 150 may output the third control signal CTL3 to the emission controller 140.

The gate driver 120 may generate gate signals GWP, GWN, GI, and GB in response to the first control signal CTL1 supplied from the driving controller 150. The gate driver 120 may output the gate signals GWP, GWN, GI, and GB to the gate lines GWPL, GWNL, GIL, and GBL, respectively.

The data driver 130 may generate a data voltage Vd based on the second control signal CTL2, the analog driving voltage AVDD, and the data signal DATA supplied from the driving controller 150. The data driver 130 may generate a gamma reference voltage based on the second control signal CTL2 and the analog driving voltage AVDD received from the driving controller 150. The gamma reference voltage may have a value corresponding to each data signal DATA. For example, the data driver 130 may generate the gamma reference voltage by distributing the analog driving voltage AVDD supplied from the driving controller 150. The data driver 130 may convert the data signal DATA into an analog data voltage Vd by using the gamma reference voltage. The data driver 130 may output the data voltage Vd to the data line DL.

The emission controller 140 may generate an emission control signal EM in response to the third control signal CTL3 supplied from the driving controller 150. The emission controller 140 may output emission control signals EM to the emission control lines EML.

Figure 2:
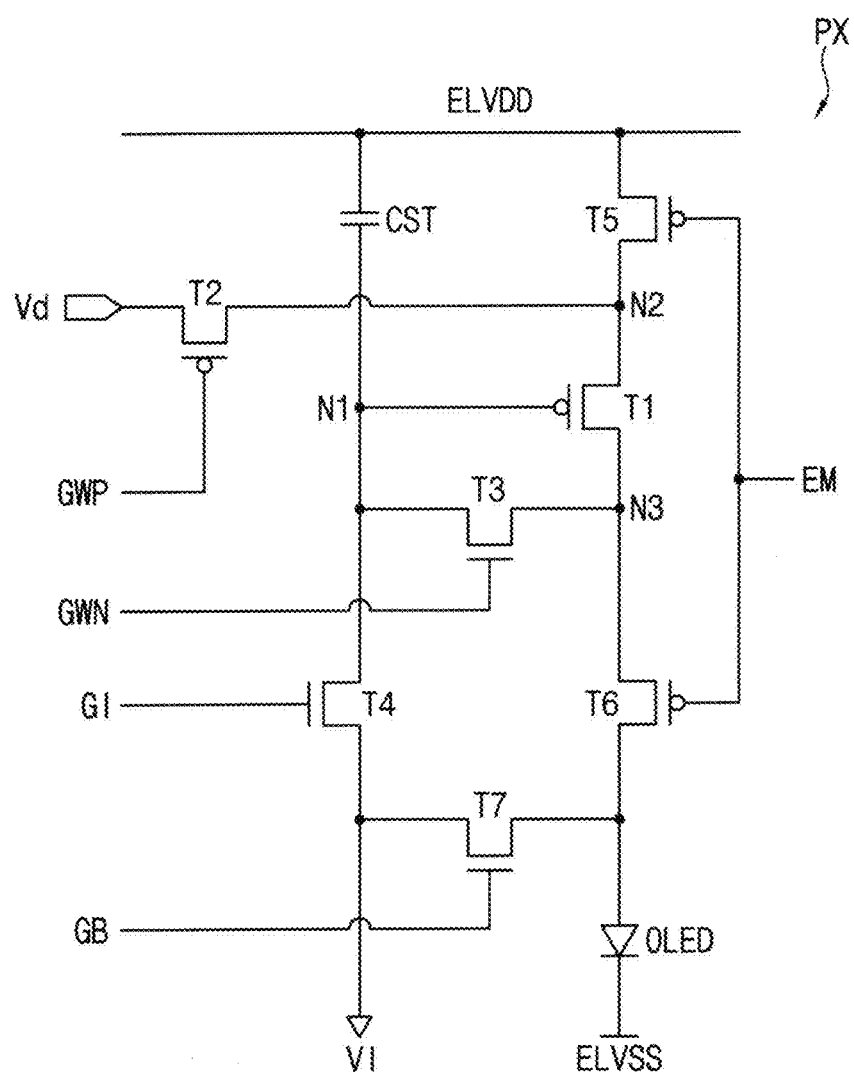
FIG. 2 is a circuit diagram illustrating an example of a pixel included in the display device of FIG. 1.
Figure 3:
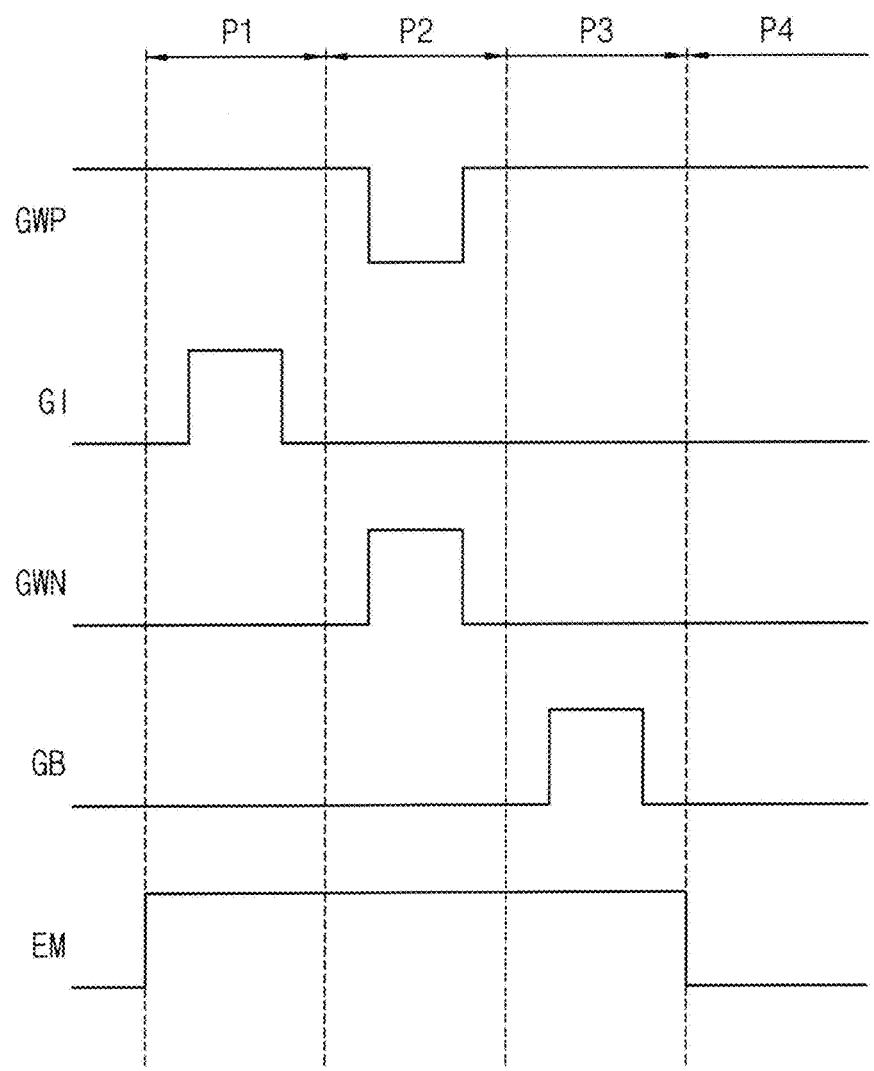
FIG. 3 is a timing diagram illustrating input signals applied to the pixel of FIG. 2.

FIG. 2 is a circuit diagram illustrating an example of a pixel included in the display device of FIG. 1, and FIG. 3 is a timing diagram illustrating input signals applied to the pixel of FIG. 2.

Referring to FIGS. 1 to 3, the display panel 110 may include a plurality of pixels PX, and each of the pixels PX may include an organic light emitting diode OLED.

The pixels PX receive data write gate signals GWP and GWN, a data initialization gate signal GI, an organic light emitting diode initialization gate signal GB, and an emission control signal EM to emit light from the organic light emitting diode OLED according to a level of the data voltage Vd, so that an image may be displayed.

According to embodiments of the present invention, each of the pixels PX may include a switching element of a first type and a switching element of a second type that is different from the first type. For example, the switching element of the first type may be a poly-silicon thin film transistor. For example, the switching element of the first type may be a low-temperature poly-silicon ("LTPS") thin film transistor. For example, the switching element of the second type may be an oxide thin film transistor. For example, the switching element of the first type may be a P-type transistor, and the switching element of the second type may be an N-type transistor.

In an embodiment, for example, the data write gate signals GWP and GWN may include a first data write gate signal GWP and a second data write gate signal GWN. The first data write gate signal GWP may be applied to the P-type transistor, and may have a low-level activation signal at a data write timing. The second data write gate signal GWN may be applied to the N-type transistor, and may have a high-level activation signal at the data write timing.

According to embodiments of the present invention, each of the pixels PX may include first to seventh switching elements T1, T2, T3, T4, T5, T6, and T7, a storage capacitor CST, and an organic light emitting diode OLED.

The first switching element T1 may include a gate electrode connected to a first node N1, a first electrode connected to a second node N2, and a second electrode connected to a third node N3. For example, the first switching element T1 may be a poly-silicon thin film transistor. The first switching element T1 may be a P-type thin film transistor. The first electrode of the first switching element T1 may be a source electrode, and the second electrode of the first switching element T1 may be a drain electrode.

The second switching element T2 may include a gate electrode to which the first data write gate signal GWP is applied, a first electrode to which the data voltage Vd is applied, and a second electrode connected to the second node N2. For example, the second switching element T2 may be a poly-silicon thin film transistor. The second switching element T2 may be a P-type thin film transistor. The first electrode of the second switching element T2 may be a source electrode, and the second electrode of the second switching element T2 may be a drain electrode.

The third switching element T3 may include a gate electrode to which the second data write gate signal GWN is applied, a first electrode connected to the first node N1, and a second electrode connected to the third node N3. For example, the third switching element T3 may be an oxide thin film transistor. The third switching element T3 may be an N-type thin film transistor. The first electrode of the third switching element T3 may be a source electrode, and the second electrode of the third switching element T3 may be a drain electrode.

The fourth switching element T4 may include a gate electrode to which the data initialization gate signal GI is applied, a first electrode to which an initialization voltage VI is applied, and a second electrode connected to the first node N1. For example, the fourth switching element T4 may be an oxide thin film transistor. The fourth switching element T4 may be an N-type thin film transistor. The first electrode of the fourth switching element T4 may be a source electrode, and the second electrode of the fourth switching element T4 may be a drain electrode.

The fifth switching element T5 may include a gate electrode to which the emission control signal EM is applied, a first electrode to which a high power supply voltage ELVDD is applied, and a second electrode connected to the second node N2. For example, the fifth switching element T5 may be a poly-silicon thin film transistor. The fifth switching element T5 may be a P-type thin film transistor. The first electrode of the fifth switching element T5 may be a source electrode, and the second electrode of the fifth switching element T5 may be a drain electrode.

The sixth switching element T6 may include a gate electrode to which the emission control signal EM is applied, a first electrode connected to the third node N3, and a second electrode connected to an anode electrode of the organic light emitting diode OLED. For example, the sixth switching element T6 may be a poly-silicon thin film transistor. The sixth switching element T6 may be a P-type thin film transistor. The first electrode of the sixth switching element T6 may be a source electrode, and the second electrode of the sixth switching element T6 may be a drain electrode.

The seventh switching element T7 may include a gate electrode to which the organic light emitting diode initialization gate signal GB is applied, a first electrode to which the initialization voltage VI is applied, and a second electrode connected to the anode electrode of the organic light emitting diode OLED. For example, the seventh switching element T7 may be an oxide thin film transistor. The seventh switching element T7 may be an N-type thin film transistor. The first electrode of the seventh switching element T7 may be a source electrode, and the second electrode of the seventh switching element T7 may be a drain electrode.

The storage capacitor CST may include a first electrode to which the high power supply voltage ELVDD is applied, and a second electrode connected to the first node N1.

The organic light emitting diode OLED may include the anode electrode, and a cathode electrode to which a low power supply voltage ELVSS is applied.

Referring to FIG. 3, the pixel PX may operate in a first period P1 to a fourth period P4. During the first period P1, the fourth switching element T4 may be turned on in response to the initialization gate signal GI, so that the first node N1 and the storage capacitor CST may be initialized with the initialization voltage VI. During the second period P2, the second switching element T2 and the third switching element T3 may be turned on in response to the first data write gate signal GWP and the second data write gate signal GWN, respectively, so that a threshold voltage of the first switching element T1 may be compensated, and the data voltage Vd for which the threshold voltage is compensated may be written in the first node N1. During the third period P3, the seventh switching element T7 may be turned on in response to the organic light emitting diode initialization gate signal GB, so that the anode electrode of the organic light emitting diode OLED may be initialized. During the fourth period P4, the fifth switching element T5 and the sixth switching element T6 may be turned on in response to the emission control signal EM, so that the organic light emitting diode OLED may emit light.

During the first period P1, the data initialization gate signal GI may have an activation level. For example, the activation level of the data initialization gate signal GI may be a high level. When the data initialization gate signal GI having the activation level is supplied, the fourth switching element T4 may be turned on, so that the initialization voltage VI may be applied to the first node N1.

During the second period P2, each of the first data write gate signal GWP and the second data write gate signal GWN may have an activation level. For example, the activation level of the first data write gate signal GWP may be a low level, and the activation level of the second data write gate signal GWN may be a high level. When the first data write gate signal GWP and the second data write gate signal GWN having the activation levels are supplied, the second switching element T2 and the third switching element T3 may be turned on. In addition, the first switching element T1 may be turned on by the initialization voltage VI. The data voltage Vd supplied to the first electrode of the second switching element T2 may be set to the first node N1 along a path formed as the first to third switching elements T1, T2, and T3 are turned on. In this case, since the third switching element T3 is turned on, the first switching element T1 is diode-connected, the data voltage Vd for which the threshold voltage of the first switching element T1 is compensated (i.e., a voltage obtained by subtracting the threshold voltage of the first switching element T1 from the data voltage Vd) may be set to the first node N1.

During the third period P3, the organic light emitting diode initialization gate signal GB may have an activation level. For example, the activation level of the organic light emitting diode initialization gate signal GB may be a high level. When the organic light emitting diode initialization gate signal GB having the activation level is supplied, the seventh switching element T7 may be turned on, so that the initialization voltage VI may be applied to the anode electrode of the organic light emitting diode OLED.

During the fourth period P4, the emission control signal EM may have an activation level. For example, the activation level of the emission control signal EM may be a low level. When the emission control signal EM having the low level is supplied, the fifth switching element T5 and the sixth switching element T6 may be turned on. In addition, the first switching element T1 may be turned on by the data voltage Vd. The first switching element T1 may generate a driving current for the organic light emitting diode OLED based on the data voltage Vd. The driving current may be supplied to the anode electrode of the organic light emitting diode OLED through the sixth switching element T6, so that the organic light emitting diode OLED may emit the light.

Figure 4:
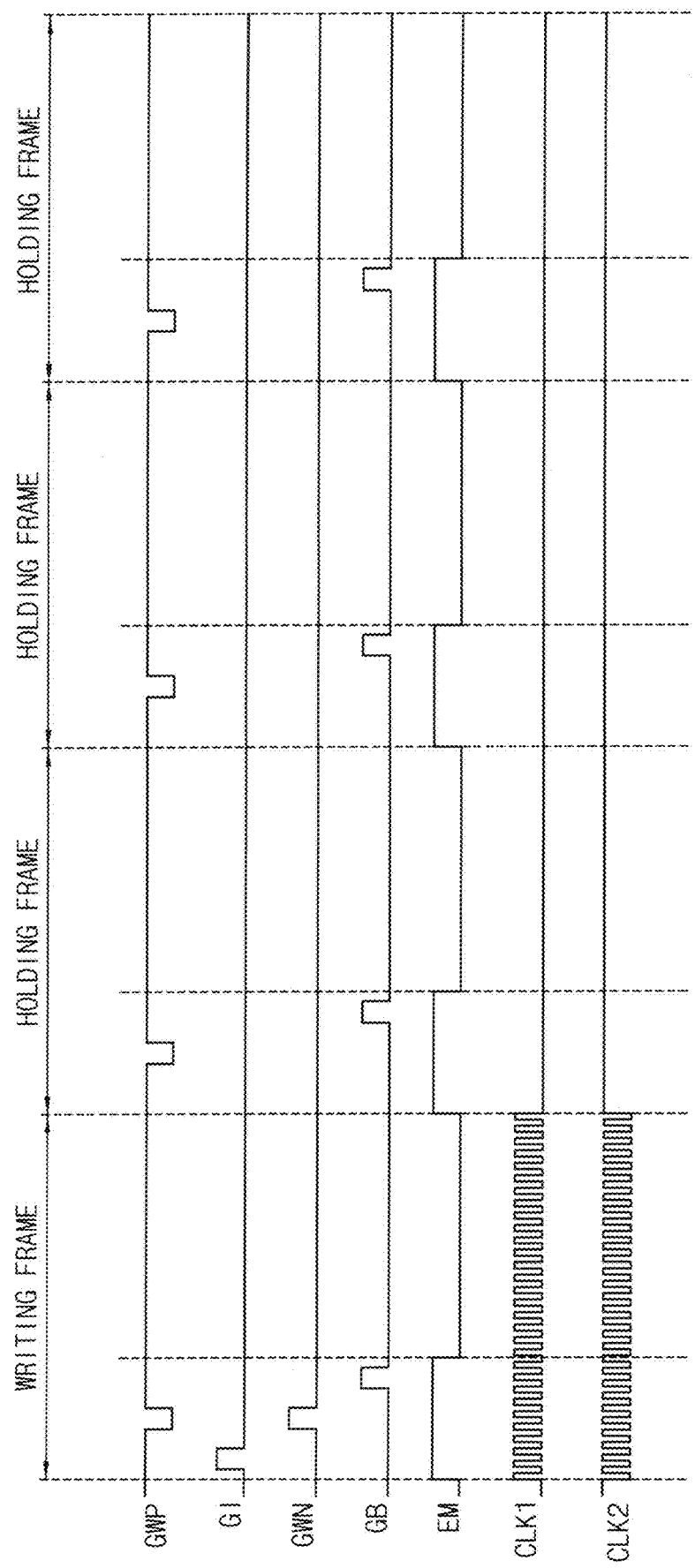
FIG. 4 is a timing diagram illustrating an example of signals applied to the pixel of FIG. 2 in a low-frequency driving mode.

FIG. 4 is a timing diagram illustrating an example of signals applied to the pixel of FIG. 2 in a low-frequency driving mode.

Referring to FIGS. 1 to 4, the display device 100 may be driven in two driving modes. First is a normal driving mode for operating at a normal driving frequency (e.g., 60 Hertz (Hz)), and the second is a low-frequency driving mode for operating at a frequency lower than the normal driving frequency. For example, when the input image data IMG is a moving image, the display panel 110 may operate in the normal driving mode. For example, when the input image data IMG is a still image, the display panel 110 may operate in the low-frequency driving mode. For example, when the display device 100 is driven in an always-on-display ("AOD") mode, the display panel 110 may operate in the low-frequency driving mode.

The display panel 100 may be driven by a unit of frames (i.e., frame-by-frame basis), and may be refreshed every frame in the normal driving mode. Therefore, the normal driving mode may include only a writing frame WRITING FRAME for writing data to a pixel PX. In the low-frequency driving mode, the display panel 110 may be refreshed at the frequency of the low-frequency driving mode, which is lower than the normal driving frequency. Therefore, the low-frequency driving mode may include a writing frame WRITING FRAME for writing data to a pixel PX, and a holding frame HOLDING FRAME for holding the data written in the pixel PX. For example, when a frequency of the normal driving mode is 60 Hz, and the frequency of the low-frequency driving mode is 1 Hz, the low-frequency driving mode may include one writing frame WRITING FRAME and 59 holding frames HOLDING FRAME during 1 second. When the frequency of the normal driving mode is 60 Hz, and the frequency of the low-frequency driving mode is 1 Hz, 59 consecutive holding frames HOLDING FRAME may be disposed between two adjacent writing frames WRITING FRAME. In this case, in the pixel PX of FIG. 2, the second switching element T2, the fifth switching element T5, and the sixth switching element T6 may operate at 60 Hz, and the third switching element T3 may operate at 1 Hz. For another example, when the frequency of the normal driving mode is 60 Hz, and the frequency of the low-frequency driving mode is 10 Hz, the low-frequency driving mode may include 10 writing frames WRITING FRAME and 50 holding frames HOLDING FRAME during 1 second. When the frequency of the normal driving mode is 60 Hz, and the frequency of the low-frequency driving mode is 10 Hz, five consecutive holding frames HOLDING FRAME may be disposed between two adjacent writing frames WRITING FRAME. In this case, in the pixel PX of FIG. 2, the second switching element T2, the fifth switching element T5, and the sixth switching element T6 may operate at 60 Hz, and the third switching element T3 may operate at 10 Hz.

Referring to FIG. 4, gate clock signals CLK1 and CLK2 may include a first gate clock signal CLK1 and a second gate clock signal CLK2. For example, the second gate clock signal CLK2 may be a signal obtained by delaying the first gate clock signal CLK1. For example, the second gate clock signal CLK2 may be an inversion signal of the first gate clock signal CLK1 (e.g., 180 degree-delay). Although the first gate clock signal CLK1 and the second gate clock signal CLK2 have been shown in FIG. 4, the gate clock signal according to the invention is not limited thereto. In another embodiment, for example, the gate driver 120 may further receive a gate clock signal according to a configuration of a stage that generates a gate signal.

The driving controller 150 of the display device 100 according to embodiments of the present invention may provide a gate clock signal having a direct current voltage (i.e., constant) to the gate driver 120 during the holding frame HOLDING FRAME. In one embodiment, in the low-frequency driving mode, each of the gate clock signals CLK1 and CLK2 may swing between a high level and a low level during the writing frame WRITING FRAME, and may be maintained at the low level during the holding frame HOLDING FRAME. In another embodiment, in the low-frequency driving mode, each of the gate clock signals CLK1 and CLK2 may swing between the high level and the low level during the writing frame WRITING FRAME, and may be maintained at the high level during the holding frame HOLDING FRAME. For example, the high level may have a gate-on voltage level, and the low level may have a gate-off voltage level.

Referring to FIG. 4, the first gate clock signal CLK1 may swing between the high level and the low level during the writing frame WRITING FRAME, and may be maintained at the low level during the holding frame HOLDING FRAME. In addition, the second gate clock signal CLK2 may swing between the high level and the low level during the writing frame WRITING FRAME, and may be maintained at the high level during the holding frame HOLDING FRAME. In the display device 100 according to embodiments of the present invention, the gate clock signals CLK1 and CLK2 may be maintained as a direct current (DC) voltage having a high level or a low level without swinging during the holding frame HOLDING FRAME in the low-frequency driving mode, so that power consumption may be effectively reduced.

Figure 5:
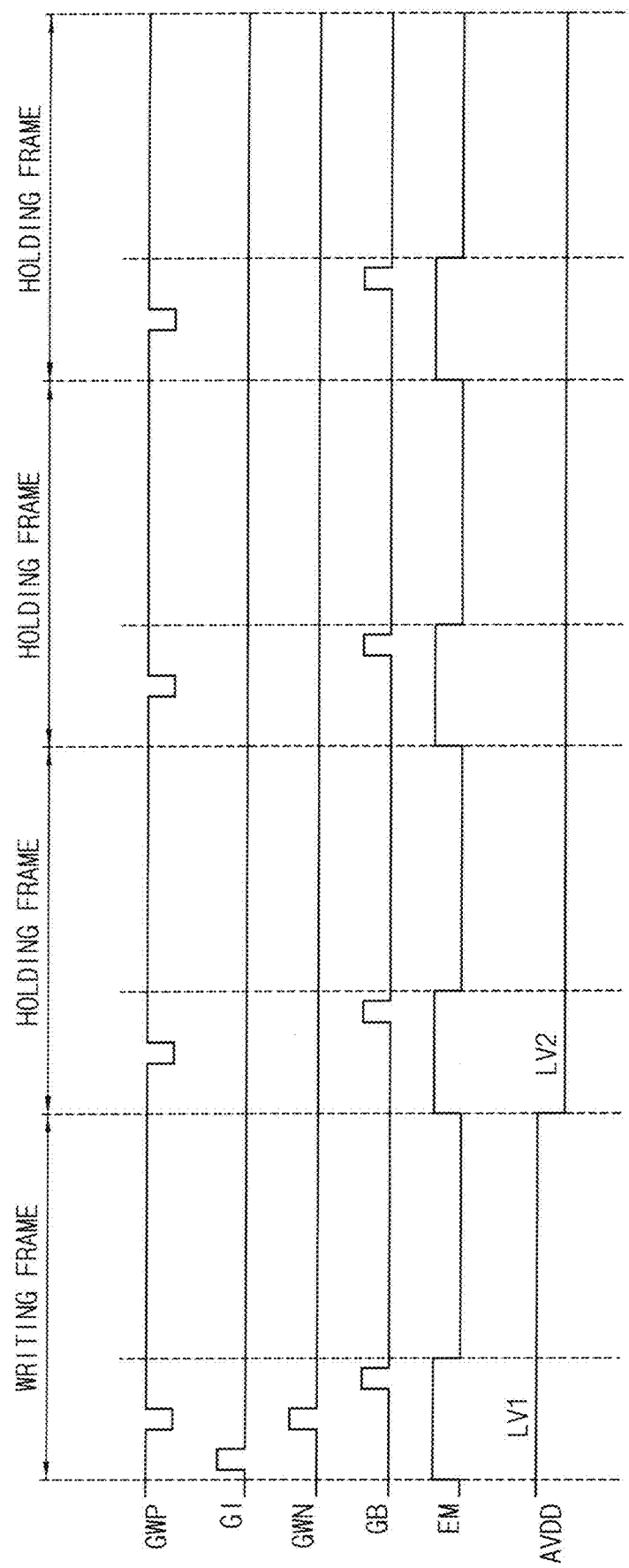
FIG. 5 is a timing diagram illustrating another example of signals applied to the pixel of FIG. 2 in a low-frequency driving mode.

FIG. 5 is a timing diagram illustrating another example of signals applied to the pixel of FIG. 2 in a low-frequency driving mode.

Referring to FIGS. 1, 2, 3, and 5, the display device may be driven in a normal driving mode for operating at a normal driving frequency (e.g., 60 Hz), and in a low-frequency driving mode for operating at a frequency lower than the normal driving frequency. For example, when the input image data IMG is a moving image, the display panel 110 may operate in the normal driving mode. For example, when the input image data IMG is a still image, the display panel 110 may operate in the low-frequency driving mode. For example, when the display device 100 is driven in an AOD mode, the display panel 110 may operate in the low-frequency driving mode.

The display panel 110 may be driven by a unit of frames (i.e., frame-by-frame basis), and may be refreshed every frame in the normal driving mode. Therefore, the normal driving mode may include only a writing frame WRITING FRAME for writing data to a pixel PX. In contrast, in the low-frequency driving mode, the display panel 110 may be refreshed at the frequency of the low-frequency driving mode, which is lower than the normal driving frequency. Therefore, the low-frequency driving mode may include a writing frame WRITING FRAME for writing data to a pixel PX, and a holding frame HOLDING FRAME for holding the data written in the pixel PX. The driving controller 150 of the display device 100 may not operate the data driver 130 during the holding frame HOLDING FRAME.

Referring to FIG. 5, in the low-frequency driving mode, the driving controller 150 of the display device 100 may provide an analog driving voltage AVDD having a first voltage level LV1 to the data driver 130 during the writing frame WRITING FRAME, and provide an analog driving voltage AVDD having a second voltage level LV2 that is lower than the first voltage level LV1 to the data driver 130 during the holding frame HOLDING FRAME. The second voltage level LV2 may have a voltage level (e.g., 0V) that does not operate the data driver 130. The data driver 130 may generate a gamma reference voltage based on the analog driving voltage AVDD having the first voltage level LV1 during the writing frame WRITING FRAME. The data driver 130 may convert the data signal DATA supplied from the driving controller 150 into the analog data voltage Vd by using the gamma reference voltage, and output the data voltage Vd to the data line DL. The data driver 130 may receive the analog driving voltage AVDD having the second voltage level LV2 during the holding frame HOLDING FRAME. The data driver 130 may not operate during the holding frame HOLDING FRAME based on the analog driving voltage AVDD having the second voltage level LV2. Therefore, in the display device 100 according to embodiments of the present invention, the data driver 130 may not operate during the holding frame HOLDING FRAME in the low-frequency driving mode, so that the power consumption may be effectively reduced.

Figure 6:
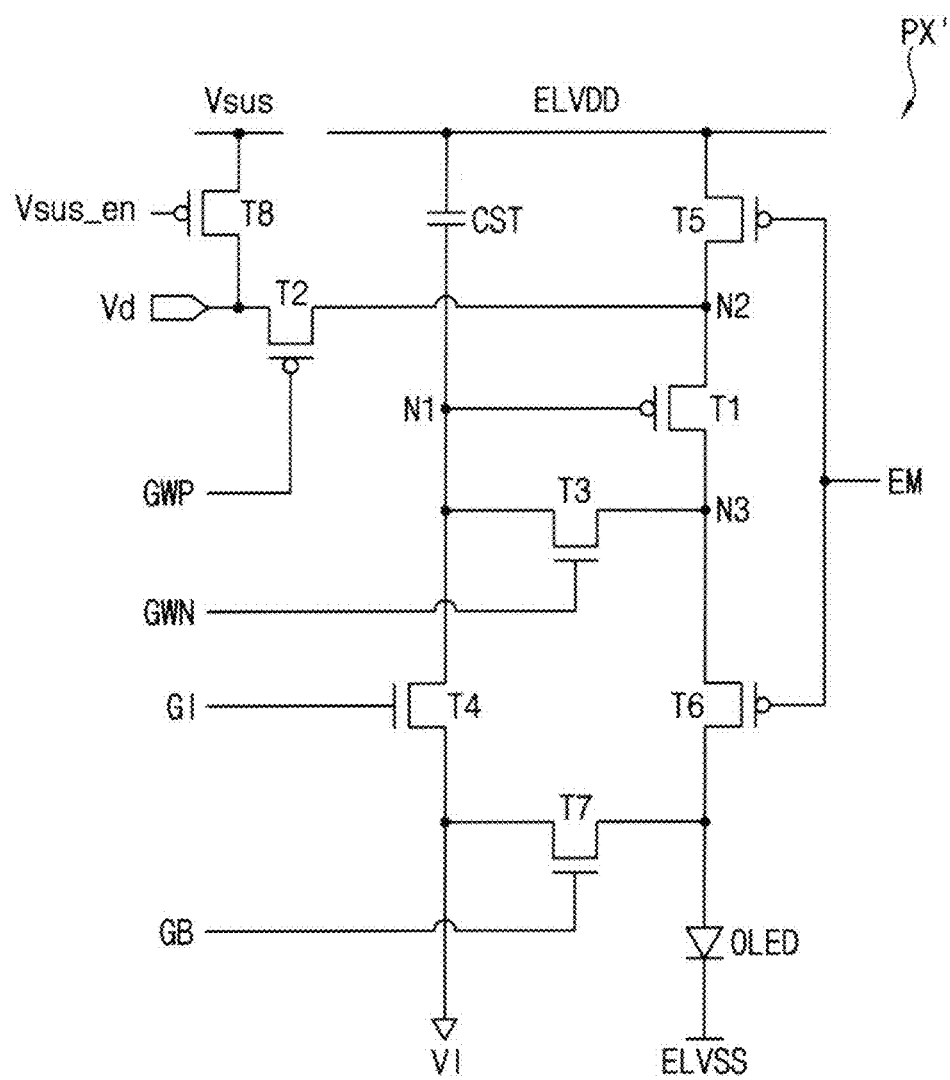
FIG. 6 is a circuit diagram illustrating another example of a pixel included in the display device of FIG. 1.
Figure 7:
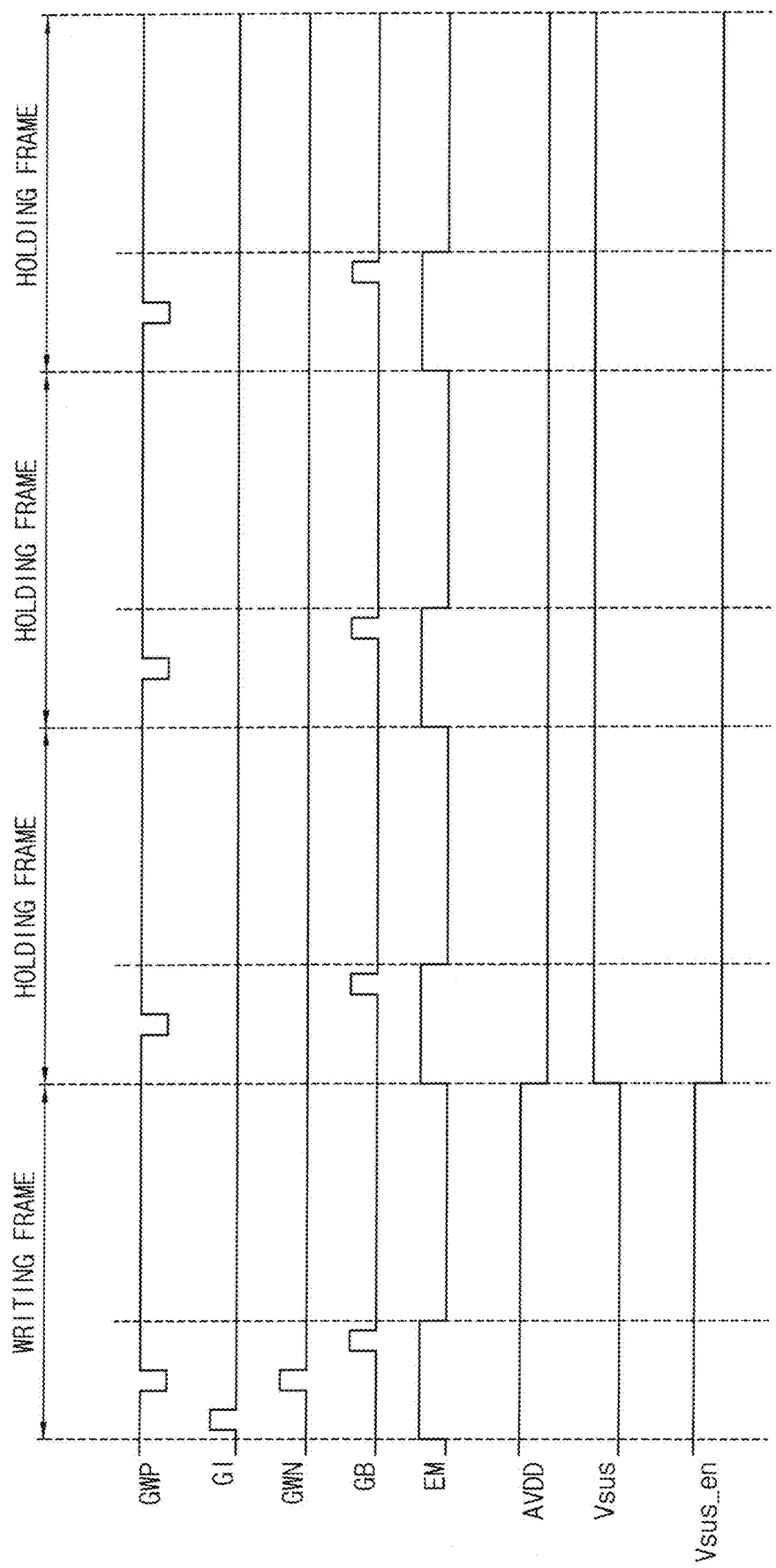
FIG. 7 is a timing diagram illustrating an example of signals applied to the pixel of FIG. 6 in a low-frequency driving mode.

FIG. 6 is a circuit diagram illustrating another example of a pixel included in the display device of FIG. 1, and FIG. 7 is a timing diagram illustrating an example of signals applied to the pixel of FIG. 6 in a low-frequency driving mode.

Referring to FIG. 6, according to embodiments of the present invention, each of pixels PX' may include first to eighth switching elements T1, T2, T3, T4, T5, T6, T7, and T8, a storage capacitor CST, and an organic light emitting diode OLED. The pixel PX' of FIG. 6 according to embodiments of the present invention may have substantially the same structure as the pixel PX of FIG. 2 except that the pixel PX' of FIG. 6 further includes the eighth switching element T8.

The eighth switching element T8 may include a gate electrode to which a sustaining voltage enable signal Vsus_en is applied, a first electrode to which a sustaining voltage Vsus is applied, and a second electrode connected to the first electrode of the second switching element T2. For example, the eighth switching element T8 may be a poly-silicon transistor. The eighth switching element T8 may be a P-type thin film transistor. The first electrode of the eighth switching element T8 may be a source electrode, and the second electrode of the eighth switching element T8 may be a drain electrode.

Referring to FIG. 7, in the low-frequency driving mode, the driving controller 150 of the display device 100 may provide the analog driving voltage AVDD to the data driver 130 during the writing frame WRITING FRAME, and provide the sustaining voltage Vsus to the pixel PX' during the holding frame HOLDING FRAME. For example, the driving controller 150 may include a voltage generator configured to generate the analog driving voltage AVDD and the sustaining voltage Vsus.

The driving controller 150 may generate a first voltage having a first voltage level and provide the generated first voltage to the data driver 130 as the analog driving voltage AVDD during the writing frame WRITING FRAME, and may generate a second voltage having a voltage level equal to or different from the first voltage level and provide the generated second voltage to the pixel PX' as the sustaining voltage Vsus during the holding frame HOLDING FRAME. Since the first voltage is not supplied to the data driver 130 during the holding frame HOLDING FRAME, the data driver 130 may not operate.

In addition, the driving controller 150 may further provide the sustaining voltage enable signal Vsus_en to the pixel PX'. Referring to FIGS. 6 and 7, the sustaining voltage enable signal Vsus_en may be activated during the holding frame HOLDING FRAME and supplied to the gate electrode of the eighth switching element T8. The eighth switching element T8 may be turned on in response to the sustaining voltage enable signal Vsus_en during the holding frame HOLDING FRAME. Therefore, the sustaining voltage Vsus may be supplied to the first electrode of the second switching element T2 through the eighth switching element T8 during the holding frame HOLDING FRAME.

In a case that the sustaining voltage Vsus is not provided to the first electrode of the second switching element T2, a leakage current may be generated through the second switching element T2 connected to the first switching element T1 during the holding frame HOLDING FRAME. When the voltage (i.e., voltage at the second node N2) of the first electrode of the first switching element T1 is changed by the leakage current generated due to the second switching element T2, the driving current for the organic light emitting diode OLED may be changed, so that luminance of the pixel PX' may be changed. However, since the pixel PX' of the display device 100 according to embodiments of the present invention supplies the sustaining voltage Vsus to the first electrode of the second switching element T2 through the eighth switching element T8 during the holding frame HOLDING FRAME, the leakage current may be effectively prevented from being generated due to the second switching element T2. Therefore, the pixel PX' may emit light with constant luminance.

As described above, since the driving controller 150 of the display device 100 according to embodiments of the present invention provides the analog driving voltage AVDD to the data driver 130 during the writing frame WRITING FRAME, and does not provide the analog driving voltage AVDD to the data driver 130 during the holding frame HOLDING FRAME, the data driver 130 may be prevented from operating during the holding frame HOLDING FRAME. Therefore, the power consumption of the display device 100 may be effectively reduced during the holding frame HOLDING FRAME. In addition, since the driving controller 150 of the display device 100 according to embodiments of the present invention provides the sustaining voltage Vsus to the pixel PX' during the holding frame HOLDING FRAME, the driving current for the organic light emitting diode OLED may be prevented from being changed due to the leakage current.

Figure 8:
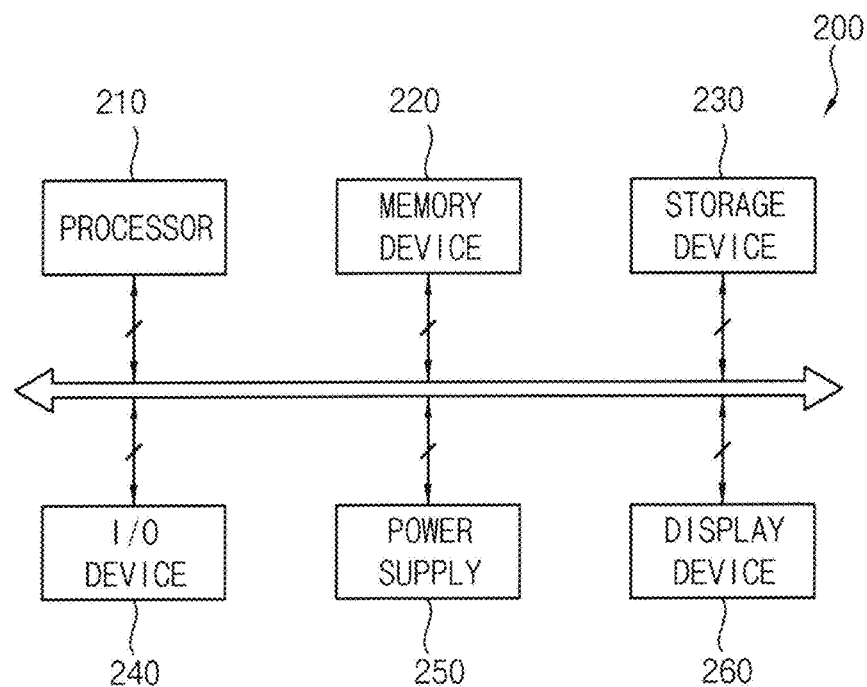
FIG. 8 is a block diagram illustrating an electronic device including the display device of FIG. 1.
Figure 9:
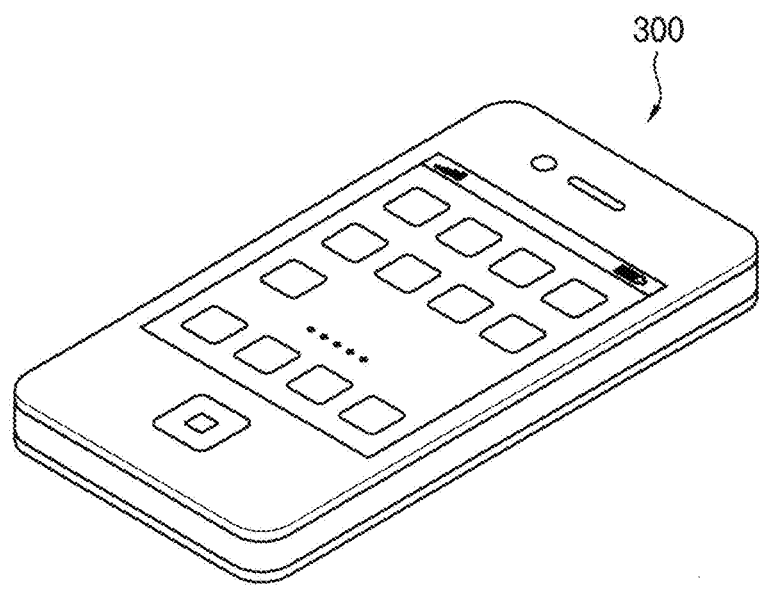
FIG. 9 is a diagram illustrating an example in which the electronic device of FIG. 8 is implemented as a smart phone.

FIG. 8 is a block diagram illustrating an electronic device including the display device of FIG. 1, and FIG. 9 is a diagram illustrating an example in which the electronic device of FIG. 8 is implemented as a smart phone.

Referring to FIGS. 8 and 9, the electronic device 200 may include a processor 210, a memory device 220, a storage device 230, an input/output ("I/O") device 240, a power supply 250, and a display device 260. Here, the display device 260 may be the display device 100 of FIG. 1. In addition, the electronic device 200 may further include a plurality of ports for communicating with a video card, a sound card, a memory card, a universal serial bus ("USB") device, other electronic devices, and the like. In an embodiment, as illustrated in FIG. 9, the electronic device 200 may be implemented as a smart phone 300. However, the electronic device 200 is not limited thereto.

The processor 210 may perform various computing functions. The processor 210 may be a micro-processor, a central processing unit ("CPU"), and the like. The processor 210 may be coupled to other components via an address bus, a control bus, a data bus, and the like. Further, the processor 210 may be coupled to an extended bus such as a peripheral component interconnection ("PCI") bus. The memory device 220 may store data for operations of the electronic device 200. For example, the memory device 220 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a magnetic random access memory ("MRAM") device, a ferroelectric random access memory ("FRAM") device, and the like and/or a volatile memory device such as a dynamic random access memory ("DRAM") device, a static random access memory ("SRAM") device, a mobile DRAM device, and the like. The storage device 230 may include a solid state drive ("SSD") device, a hard disk drive ("HDD") device, a CD-ROM device, and the like.

The I/O device 240 may include an input device such as a keyboard, a keypad, a mouse device, a touch-pad, a touch-screen, and the like and an output device such as a printer, a speaker, and the like. In some embodiments, the display device 260 may be included in the I/O device 240. The power supply 250 may provide power for operations of the electronic device 200. The display device 260 may be coupled to other components via the buses or other communication links.

As described above, the display device 260 may include a display panel, a gate driver, a data driver, an emission controller, and a driving controller. The display panel may include a plurality of pixels. The driving controller may generate control signals for controlling the gate driver, the data driver, and the emission controller based on input image data and an input control signal. The gate driver may generate a gate signal based on a first control signal supplied from the driving controller, and output the gate signal to a gate line of the display panel. The data driver may generate a data signal based on a second control signal supplied from the driving controller, and output the data signal to a data line of the display panel. The emission controller may generate an emission control signal based on a third control signal supplied from the driving controller, and output the emission control signal to an emission control line of the display panel.

The driving controller may generate the first control signal for controlling an operation of the gate driver based on the input control signal. For example, the first control signal may include a vertical start signal and a gate clock signal. According to embodiments of the present invention, in a low-frequency driving mode, the display panel may operate in a writing frame for writing data to the pixel and a holding frame for holding the data written in the pixel. In one embodiment, the driving controller may provide a gate clock signal having a direct current voltage (i.e., constant voltage) to the gate driver during the holding frame, so that power consumption of the display device 260 may be reduced.

The driving controller may generate the second control signal for controlling an operation of the data driver based on the input control signal. The driving controller may generate an analog driving voltage for operating the data driver. In one embodiment, the driving controller of the display device 260 according to embodiments of the present invention may not operate the data driver during the holding frame. For example, the driving controller may provide an analog driving voltage having a first voltage level to the data driver during the writing frame, and provide an analog driving voltage having a second voltage level (e.g., 0V) to the data driver during the holding frame. Since the data driver does not operate during the holding frame, the power consumption of the display device 260 may be reduced. In another embodiment, the driving controller of the display device 260 according to embodiments of the present invention may provide the analog driving voltage having the first voltage level to the data driver during the writing frame, and provide a sustaining voltage having a third voltage level to the pixel during the holding frame. Since the data driver does not receive the analog driving voltage during the holding frame, the data driver may not operate. In addition, since the pixel receives the sustaining voltage during the holding frame, a leakage current of a driving transistor (a first switching element) may be prevented from being generated. Therefore, the power consumption of the display device 260 may be reduced, and display quality may be improved.

ABILITY OF INDUSTRIAL UTILITY

The present invention may be applied to an electronic device including a display device. For example, the present invention may be applied to a television, a computer monitor, a laptop, a digital camera, a smart phone, a cellular phone, a smart pad, a tablet PC, a personal digital assistant ("PDA"), a portable multimedia player ("PMP"), an MP3 player, a car navigation system, a video phone, a head mounted display ("HMD") device, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
a display panel including a pixel including a switching element of a first type and a switching element of a second type that is different from the first type;
a gate driver which generates a gate signal based on a gate clock signal and provides the gate signal to the display panel;
a data driver which provides a data voltage to the display panel;
an emission controller which provides an emission control signal to the display panel; and
a driving controller which generates control signals for controlling the gate driver, the data driver, and the emission controller,
wherein, in a low-frequency driving mode, the driving controller is configured to provide the gate clock signal that toggles between a high level and a low level to the gate driver during a writing frame for writing data to the pixel and to provide the gate clock signal having a direct current (DC) voltage to the gate driver during a holding frame for holding the data written in the pixel, the gate clock signal including a first gate clock signal and a second gate clock signal, and
wherein, during the holding frame, the first gate clock signal maintains the low level and the second gate clock signal maintains the high level.

2. The display device of claim 1, wherein, in the low-frequency driving mode, the first gate clock signal toggles between the high level and the low level during the writing frame and is maintained at the low level during the holding frame.

3. The display device of claim 1, wherein, in the low-frequency driving mode, the second gate clock signal toggles between the high level and the low level during the writing frame and is maintained at the high level during the holding frame.

4. The display device of claim 1, wherein the switching element of the first type is a poly-silicon thin film transistor, and
wherein the switching element of the second type is an oxide thin film transistor.

5. The display device of claim 4, wherein the switching element of the first type is a P-type transistor, and
wherein the switching element of the second type is an N-type transistor.

6. The display device of claim 4, wherein the pixel includes:
a first switching element including a gate electrode connected to a first node, a first electrode connected to a second node, and a second electrode connected to a third node;
a second switching element including a gate electrode to which a first data write gate signal is applied, a first electrode to which the data voltage is applied, and a second electrode connected to the second node;
a third switching element including a gate electrode to which a second data write gate signal is applied, a first electrode connected to the first node, and a second node connected to the third node;
a fourth switching element including a gate electrode to which a data initialization gate signal is applied, a first electrode to which an initialization voltage is applied, and a second electrode connected to the first node;
a fifth switching element including a gate electrode to which the emission control signal is applied, a first electrode to which a high power supply voltage is applied, and a second electrode connected to the second node;
a sixth switching element including a gate electrode to which the emission control signal is applied, a first electrode connected to the third node, and a second electrode connected to an anode electrode of an organic light emitting diode;
a seventh switching element including a gate electrode to which an organic light emitting diode initialization gate signal is applied, a first electrode to which the initialization voltage is applied, and a second electrode connected to the anode electrode of the organic light emitting diode;
a storage capacitor including a first electrode to which the high power supply voltage is applied and a second electrode connected to the first node; and
the organic light emitting diode including the anode electrode and a cathode electrode to which a low power supply voltage is applied,
wherein the gate signal generated from the gate driver includes the first and second data write gate signals, the data initialization gate signal, and the organic light emitting diode initialization gate signal.

7. The display device of claim 6, wherein the first switching element, the second switching element, the fifth switching element, and the sixth switching element are the poly-silicon thin film transistors, and
wherein the third switching element, the fourth switching element, and the seventh switching element are the oxide thin film transistors.

8. The display device of claim 6, wherein, in the low-frequency driving mode, the second switching element, the fifth switching element, and the sixth switching element are driven at a first driving frequency, and the third switching element is driven at a second driving frequency that is lower than the first driving frequency.

9. The display device of claim 1, wherein the driving controller includes a gate controller which generates the gate clock signal.

10. A display device comprising:
a display panel including a pixel including a switching element of a first type and a switching element of a second type that is different from the first type;
a gate driver which provides a gate signal to the display panel;
a data driver which provides a data voltage to the display panel;
an emission controller which provides an emission control signal to the display panel; and
a driving controller which generates control signals for controlling the gate driver, the data driver, and the emission controller,
wherein, in a low-frequency driving mode, the driving controller provides the data driver with a first analog driving voltage having a first voltage level that causes the data driver to operate during a writing frame for writing data to the pixel, and
wherein, in the low-frequency driving mode, the driving controller provides the data driver with a second analog driving voltage having a second voltage level that causes the data driver not to operate during a holding frame for holding the data written in the pixel and provides a sustaining voltage having a third voltage level for constantly maintaining a driving current of the pixel during the holding frame.

11. The display device of claim 10, wherein the second voltage level of the second analog driving voltage is lower than the first voltage level of the first analog driving voltage level.

12. The display device of claim 10, wherein the switching element of the first type is a poly-silicon thin film transistor, and
wherein the switching element of the second type is an oxide thin film transistor.

13. The display device of claim 12, wherein the switching element of the first type is a P-type transistor, and
wherein the switching element of the second type is an N-type transistor.

14. The display device of claim 10, wherein the driving controller includes a voltage generator which generates the voltages provided to the data driver and the pixel.

15. A display device comprising:
a display panel including a pixel including a switching element of a first type and a switching element of a second type that is different from the first type;
a gate driver which provides a gate signal to the display panel;
a data driver which provides a data voltage to the display panel;
an emission controller which provides an emission control signal to the display panel; and
a driving controller which generates control signals for controlling the gate driver, the data driver, and the emission controller,
wherein, in a low-frequency driving mode, the driving controller provides the data driver with a first analog driving voltage having a first voltage level that causes the data driver to operate during a writing frame for writing data to the pixel and provides the data driver with a second analog driving voltage having a second voltage level that causes the data driver not to operate during a holding frame for holding the data written in the pixel,
wherein the switching element of the first type is a poly-silicon thin film transistor and the switching element of the second type is an oxide thin film transistor,
wherein the pixel includes:
a first switching element including a gate electrode connected to a first node, a first electrode connected to a second node, and a second electrode connected to a third node;
a second switching element including a gate electrode to which a first data write gate signal is applied, a first electrode to which the data voltage is applied, and a second electrode connected to the second node;
a third switching element including a gate electrode to which a second data write gate signal is applied, a first electrode connected to the first node, and a second node connected to the third node;
a fourth switching element including a gate electrode to which a data initialization gate signal is applied, a first electrode to which an initialization voltage is applied, and a second electrode connected to the first node;
a fifth switching element including a gate electrode to which the emission control signal is applied, a first electrode to which a high power supply voltage is applied, and a second electrode connected to the second node;
a sixth switching element including a gate electrode to which the emission control signal is applied, a first electrode connected to the third node, and a second electrode connected to an anode electrode of an organic light emitting diode;
a seventh switching element including a gate electrode to which an organic light emitting diode initialization gate signal is applied, a first electrode to which the initialization voltage is applied, and a second electrode connected to the anode electrode of the organic light emitting diode;
a storage capacitor including a first electrode to which the high power supply voltage is applied and a second electrode connected to the first node; and
the organic light emitting diode including the anode electrode and a cathode electrode to which a low power supply voltage is applied, and
wherein the gate signal provided from the gate driver includes the first and second data write gate signals, the data initialization gate signal, and the organic light emitting diode initialization gate signal.

16. The display device of claim 15, wherein the first switching element, the second switching element, the fifth switching element, and the sixth switching element are the poly-silicon thin film transistors, and
wherein the third switching element, the fourth switching element, and the seventh switching element are the oxide thin film transistors.

17. The display device of claim 15, wherein, in the low-frequency driving mode, the second switching element, the fifth switching element, and the sixth switching element are driven at a first driving frequency, and the third switching element is driven at a second driving frequency that is lower than the first driving frequency.

18. The display device of claim 15, wherein the pixel further includes:
an eighth switching element including a gate electrode to which a sustaining voltage enable signal is applied, a first electrode to which a sustaining voltage is applied, and a second electrode connected to the first electrode of the second switching element.

19. The display device of claim 18, wherein, in the low-frequency driving mode, the driving controller is configured to provide the first analog driving voltage to the data driver during the writing frame and to provide the sustaining voltage to the pixel during the holding frame.

20. The display device of claim 19, wherein the eighth switching element is the poly-silicon thin film transistor.

* * * * *